United States Patent [19] [11] 4,387,350

Bessolo et al. [45] Jun. 7, 1983

[54] WATCH CIRCUIT WITH OSCILLATOR GAIN CONTROL

[75] Inventors: Jeffrey M. Bessolo, Somerville; James E. Gillberg, North Plainfield, both of N.J.

[73] Assignee: RCA Corporation, New York, N.Y.

[21] Appl. No.: 220,128

[22] Filed: Dec. 24, 1980

[51] Int. Cl.³ .............................................. H03B 5/36

[52] U.S. Cl. .............................. 331/116 FE; 368/159

[58] Field of Search ..................... 331/116 FE, 116 R; 368/159, 204, 219

[56] References Cited

U.S. PATENT DOCUMENTS 4,039,973 8/1977 Yamashiro .................... 331/116 FE
4,064,468 12/1977 Kumata ........................ 331/116 FE
4,282,496 8/1981 Heuner ........................ 331/116 FE
4,307,354 12/1981 Miyagawa et al. .......... 331/116 FE

*Primary Examiner*—Siegfried H. Grimm
*Assistant Examiner*—Edward P. Westin
*Attorney, Agent, or Firm*—E. M. Whitacre; P. J. Rasmussen; L. C. Edelman

[57] ABSTRACT

A watch circuit arrangement for conserving battery power includes a feedback connection between the crystal oscillator of the watch circuit and the display voltage generator which is responsive to the crystal oscillator output to develop sufficient output voltage for the watch display. Specifically, the output of the display voltage generator, which may be a voltage multiplier, is sensed by a display voltage sensing circuit which controls the gain of the crystal oscillator. Initially, when battery power is applied to the watch circuit, the voltage multiplier has zero output voltage, which conditions the crystal oscillator to have a sufficiently high gain to start the oscillator. After several cycles of oscillator signal, the voltage multiplier output increases, which conditions the crystal oscillator to have a lower gain for reducing power consumption while sustaining oscillation.

10 Claims, 1 Drawing Figure

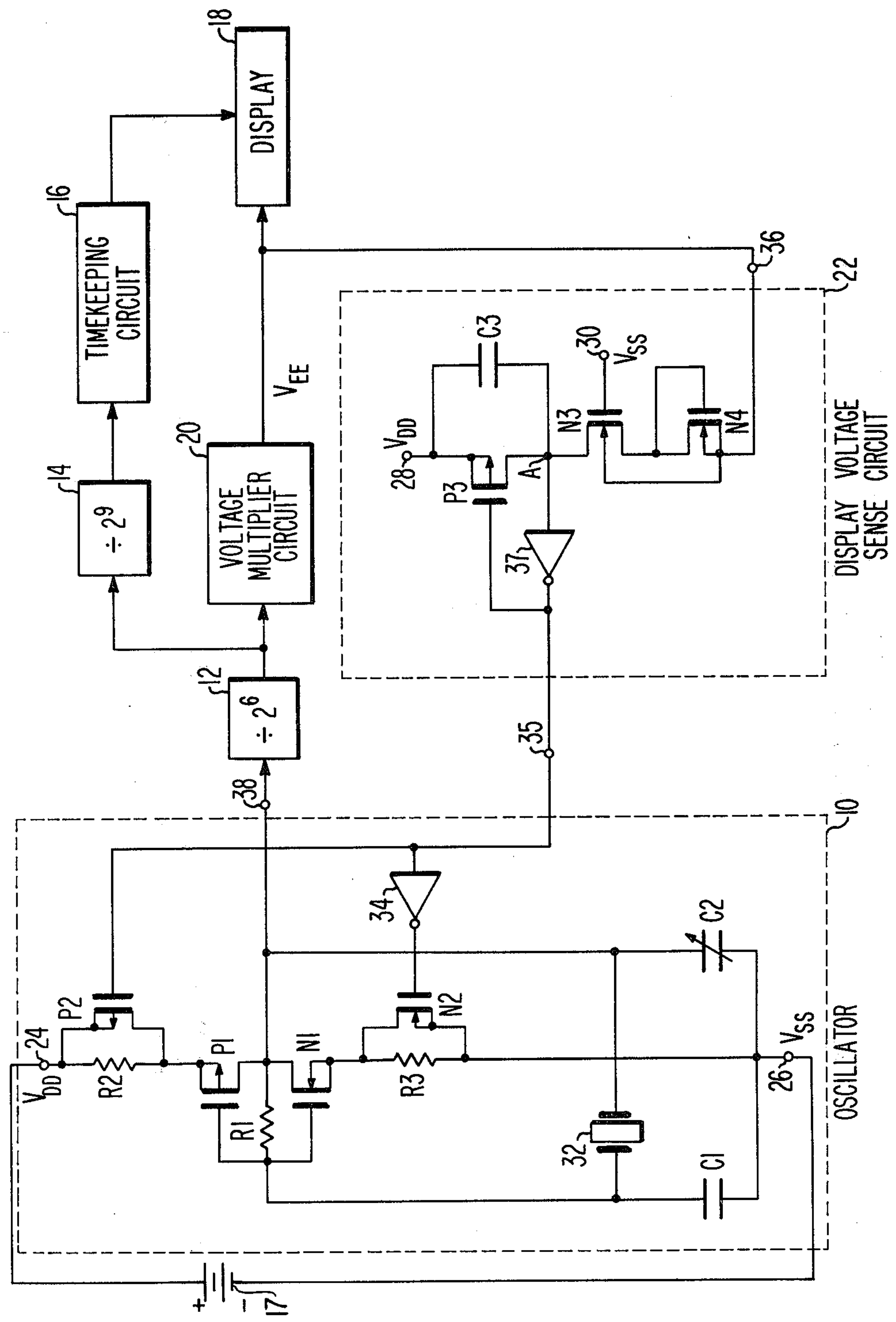
DISPLAY
18
TIMEKEEPING CIRCUIT
16
÷ 2^9
14
VOLTAGE MULTIPLIER CIRCUIT
20
V_EE
÷ 2^6
12
38
35
36
22
C3
30
V_SS
28
V_DD
P3
A
N3
N4
37
DISPLAY VOLTAGE SENSE CIRCUIT
10
34
C2
P2
N2
24
V_DD
R2
P1
N1
R1
R3
32
C1
26
V_SS
OSCILLATOR
17

WATCH CIRCUIT WITH OSCILLATOR GAIN CONTROL

FIELD OF THE INVENTION

This invention relates to watch circuit arrangements wherein power consumption is reduced.

BACKGROUND OF THE INVENTION

In a watch circuit, power consumption is critical because battery life and battery size are related to the power consumption of the circuit. Generally, the less power required, the smaller the allowable battery size and the longer a battery of a given size will last.

Watch circuits typically include an oscillator for producing periodic pulses at a stable frequency, and a chain of frequency divider stages for dividing the oscillator frequency down to a convenient periodic time reference, such as one pulse per second. The one pulse per second signal drives timekeeping circuitry which in turn provides signals to the watch display.

Since the oscillator and the first few divider stages of the frequency divider chain operate at the highest frequency of the circuit, a major percentage of the total circuit power consumption occurs there. A significant amount of the power consumption is due to the operation of the oscillator alone.

The power consumption of the oscillator can be reduced by reducing the gain of the amplifier used in the regenerative feedback loop of the oscillator. However, if the oscillator amplifier gain is reduced so that a significant reduction in operating current is realized, then the time required for the oscillator to start when battery power is initially applied to the circuit becomes excessively long, or the oscillator may fail to start at all. Since the starting time of the oscillator is partially dependent on external capacitors used for trimming the oscillator frequency, the starting time, or the failure to start, varies with each individual watch circuit. Preferably, the starting time should be no longer than 3 seconds in order to expedite testing of watch assemblies during manufacture, and to be acceptable to the consumer.

It is known to provide an oscillator initiation circuit which controls the gain of an oscillator so that the oscillator has a high gain at the time of initiation in order to provide a shortened period of oscillator initiation time, and thereafter has a lower gain in order to avoid excessive power consumption. For example, see U.S. Pat. No. 4,039,973 to O. Yamashiro which discloses an initiation circuit in a crystal controlled oscillator.

SUMMARY OF THE INVENTION

In watch circuits of the type including a display voltage generator responsive to the oscillator signal for boosting the battery voltage to a level sufficient to operate the watch display, the present invention provides a watch circuit arrangement wherein the gain of the oscillator is responsive to the output of the display voltage generator. In such manner, the display voltage generator is not only the power source for the watch display, but also controls the gain of the oscillator. Initially, when battery power is first applied to the circuit, the output of the display voltage generator is low, which conditions the oscillator to have a relatively higher gain for starting oscillation. After several cycles of output signal are provided by the oscillator, the display voltage generator output increases, which conditions the oscillator to have a relatively lower gain, thereby sustaining steady state oscillation and reducing power consumption.

BRIEF DESCRIPTION OF THE DRAWING

The sole FIGURE illustrates a watch circuit arrangement embodying the present invention.

DETAILED DESCRIPTION

As shown in the FIGURE, a basic watch arrangement comprises a crystal oscillator 10 for providing periodic pulses of a stable frequency (e.g., 32,768 Hz.) at terminal 38, a frequency divider 12 for dividing the oscillator signal frequency by $2^6$ (64) and another frequency divider 14 for further dividing the oscillator signal frequency by $2^9$ (512) to provide an output signal which has a frequency of one pulse per second. The one pulse per second signal is applied to a timekeeping circuit 16 which counts the one second pulses to produce a binary coded representation of time in minutes and hours. A suitable display 18, such as a liquid crystal display (LCD) is responsive to the binary signals generated by the timekeeping circuit 16 to display the time.

The watch circuit is powered by a battery 17 which provides an energizing potential $V_{DD}$ of 1.5 volts and a reference potential $V_{SS}$ of 0 volts. The LCD display, however, often requires a larger voltage than the battery can supply. For example, a typical LCD display can require 2.2 volts. In order to generate a voltage greater than the battery voltage $V_{DD}$, a voltage multiplier circuit 20 is provided for boosting the battery voltage to a level sufficient to operate the display. Voltage multipliers are well known. A typical voltage multiplier includes one or more capacitors and a switching network that connects the capacitor, or capacitors, in series with the battery and selectively charges each capacitor up to the battery voltage, so as to produce an output voltage that is a whole number multiple of the battery voltage.

Alternatively, the voltage multiplier circuit 20 can be any display voltage generator that is responsive to the signal from the oscillator 10 for providing a display voltage $V_{EE}$ after the oscillator 10 has started up and reached a steady state condition. The particular display voltage generator shown, i.e. , the voltage multiplier circuit 20, is driven by the 512 Hz. signal from the frequency divider 12 to produce a display voltage $V_{EE}$ of −3.0 volts. The display voltage $V_{EE}$ starts at zero volts when power is first applied, and with each successive cycle of the 512 Hz. signal from frequency divider 12, operates to increase the display voltage generator output towards the steady state value of $V_{EE}$.

The present watch circuit arrangement is further provided with a feedback connection between the voltage multiplier circuit 20 and the oscillator 10 which lowers the gain of oscillator 10 after the display voltage $V_{EE}$ reaches a predetermined level. Specifically, the display voltage $V_{EE}$ is sensed at terminal 36 by a display voltage sense circuit 22, the output of which is connected to a gain control input of oscillator 10 at terminal 35.

The oscillator 10 comprises an amplifier including resistor R1, one P-channel field effect transistor (FET) P1 and one N-channel FET N1, a gain control arrangement comprising one P-channel FET P2 and one N-channel FET N2, and two resistors R2 and R3, and an oscillator feedback network comprising a quartz crystal 32 and two capacitors C1 and C2.

Transistors P1 and N1 are connected as a complementary symmetry FET amplifier, with respective gate electrodes connected together at an input point, and respective drain electrodes connected together at an output point. The source electrode of transistor P1 is connected to terminal 24, which receives the relatively positive battery operating potential $V_{DD}$ of 1.5 volts, through the parallel combination of resistor R2 and the conduction channel of transistor P2. The source electrode of transistor N1 is connected to terminal 26, which receives the relatively negative battery reference potential $V_{SS}$ of 0 volts, through the parallel combination of resistor R3 and the conduction channel of transistor N2.

Resistor R1 provides a drain-to-gate dc feedback path to bias the amplifier formed by transistors P1 and N1 to operate near the midpoint of its transfer characteristics. The oscillator is conditioned to oscillate by the feedback network including crystal 32 and capacitors C1 and C2. The frequency of oscillation is substantially determined by the resonant frequency of the crystal 32, at which frequency the feedback network provides 180° of phase shift between the output and input points of amplifier P1, N1. Capacitors C1 and C2 are impedance matching components for trimming the oscillator frequency.

Oscillator 10 is further provided with a gain control terminal 35 which is connected to the input of inverter 34 and to the gate electrode of transistor P2. The output of inverter 34 is connected to the gate electrode of transistor N2. Inverter 34 also receives battery supply potentials $V_{DD}$ and $V_{SS}$.

The logic level on terminal 35 controls the gain of the oscillator amplifier P1, N1. In particular, when terminal 35 is at logic 0 (i.e., $V_{SS}$) transistor P2 is conditioned for conduction. At the same time, the output of inverter 34 is at logic 1 ($V_{DD}$) which conditions transistor N2 for conduction. The conduction impedance of transistors P2 and N2 is much smaller than the impedance of resistors R2 and R3, respectively. The gain of the oscillator amplifier P1, N1 is controlled by the effective impedance between the source electrodes of transistors P1 and N1 and the power supply terminals 24 and 26 for receiving $V_{DD}$ and $V_{SS}$, respectively. Therefore, a logic 0 on terminal 35 increases the gain of the oscillator amplifier P1, N1.

When terminal 35 is at logic 1, transistor P2 is conditioned for non-conduction. At the same time, the output of inverter 34 is at logic 0 which conditions transistor N2 for non-conduction. Since transistors P2 and N2 are conditioned for non-conduction, the resistors R2 and R3 reduce the voltage and current available for transistors P1 and N1, which in turn reduces the gain of the oscillator amplifier P1, N1.

As previously stated, the gain control input terminal 35 of the oscillator 10 is connected to the output of the display voltage sense circuit 22 which in turn has its input connected to the output of the voltage multiplier circuit 20. The display voltage sense circuit 22 comprises two N-channel FET transistors N3 and N4, an inverter 37, a P-channel FET transistor P3 and a capacitor C3. The conduction channels of transistors N3 and N4 are connected in series between the input terminal 36 for receiving $V_{EE}$ and a circuit node A. Transistor N4 is provided with a gate-to-drain connection. Node A is connected to the output terminal 35 through the inverter 37. Node A is further connected to terminal 28, which receives the battery operating potential $V_{DD}$, through the parallel combination of capacitor C3 and the conduction channel of transistor P3. The gate electrode of transistor P3 is connected to the output terminal 35. The gate electrode of transistor N3 is connected to the battery reference potential $V_{SS}$ at terminal 30. Therefore, the gate-to-source voltage of transistor N4 is connected in series with the gate-to-source voltage of transistor N3 between $V_{SS}$ and the display voltage $V_{EE}$.

In operation, when the battery is initially installed, the difference between the $V_{DD}$ potential and the $V_{SS}$ potential is impressed across terminals 24 and 26 and terminals 28 and 30. Inverter 37 also receives battery supply potentials $V_{DD}$ and $V_{SS}$. Node A is initially at $V_{DD}$ potential since the voltage across capacitor C3 cannot change instantaneously. Accordingly, the output of inverter 37 at terminal 35 is at logic 0 which conditions transistor P3 to conduct, holding node A at $V_{DD}$ potential. At the same time, the output voltage $V_{EE}$ of the voltage multiplier circuit 20 is initially 0 since no signal has yet been produced by oscillator 10. Therefore, since $V_{SS}-V_{EE}$ is initially zero, the sum of the gate-to-source voltages of transistors N3 and N4 is initially zero, rendering at least one of those transistors non-conductive, and permitting transistor P3 to hold node A at $V_{DD}$ potential. Also, since terminal 35 is initially at logic 0, the oscillator amplifier P1, N1 is initially conditioned to have a high gain in order to facilitate starting oscillation.

After oscillator 10 has started and a sufficient number of oscillator cycles have elapsed, the voltage multiplier circuit output $V_{EE}$ begins to approach its steady state value of $-3$ volts. As the display voltage $V_{EE}$ at terminal 36 falls below $V_{SS}$ by an amount greater than the sum of the threshold voltage of transistor N3 plus the threshold voltage of transistor N4, transistors N3 and N4 conduct pulling node A towards $V_{EE}$. Assuming the N-channel threshold voltage to be 0.6 volts. transistors N3 and N4 will begin to conduct when $V_{SS}-V_{EE}$ exceeds 1.2 volts. In such manner, the threshold voltages of N3 and N4 provide an inherent voltage reference to be compared to the output $V_{EE}$ of the voltage multiplier circuit 20. When the potential at node A falls below the logic threshold of inverter 37, the logic level at terminal 35 switches to logic 1 which conditions the oscillator amplifier P1, N1 to have a reduced gain sufficient for sustaining oscillation.

Preferably, circuit parameters (i.e., the values of resistors R2 and R3, and the sizes of transistors P2 and N2) are chosen so that the oscillator high gain condition is sufficient to initiate oscillation within a reasonable time under worst case conditions. Also, such circuit parameters are chosen so that the oscillator low gain condition is sufficient to maintain oscillations at a minimum battery current under worst case conditions. Typically, the minimum sustaining current can be reduced to a value equal to one-half of the minimum starting current, thereby extending the life of the battery.

The feedback arrangement of the present invention, i.e., between the voltage multiplier circuit 20 and oscillator 10, ensures that the oscillator high gain condition is maintained in oscillator 10 for whatever time necessary for steady state oscillations to be initiated. After stable oscillations are detected by the presence of $V_{EE}$, via the display voltage sense circuit 22, the low gain condition is established in the oscillator, thus conserving battery power.

It is understood that other embodiments of the display voltage sensing circuit will occur to those skilled in the electronic arts. For example, a comparator and a separate reference voltage may be used to sense the presence of display voltage $V_{EE}$. Furthermore, oscillator gain control is realizeable by alternate means such as selectively connecting a second inverter amplifier in parallel with transistors P1 and N1 responsive to a gain control signal. It should further be realized that although enhancement mode FET transistors are employed in the embodiment shown, other watch circuits arranged in accordance with the present invention may be realized using other transistor types, such as bipolar transistors.

What is claimed is:

1. In a watch circuit arrangement having an oscillator, and having a display voltage generator including a voltage multiplier coupled to said oscillator for generating an output voltage which exceeds a given magnitude only after the receipt of a plurality of pulses from said oscillator, the improvement comprising:

DC voltage threshold detector means responsive to said output voltage for conditioning said oscillator to have a first gain level when said output voltage does not exceed said given magnitude, and for conditioning said oscillator to have a second gain level, lower than said first gain level, when said output voltage does exceed said given value.

2. A watch circuit arrangement according to claim 1 wherein said DC voltage threshold detector means comprises:

a threshold detector having input and output terminals, said input terminal connected for receiving said output voltage, said threshold detector providing a first level of binary signal at said output terminal when said output voltage does not exceed said given magnitude, and providing a second level of binary control signal at said output terminal when said output voltage does exceed said given magnitude; and oscillator gain control means, including a gain control terminal connected to said output terminal of said DC voltage threshold detector, said oscillator gain control means being responsive to said first level of binary control signal at said gain control terminal for conditioning said oscillator to have said first gain level, and responsive to said second level of binary control signal at said gain control terminal for conditioning said oscillator to have said relatively lower second gain level.

3. A watch circuit arrangement according to claim 2 wherein said DC voltage threshold detector comprises:

first and second FET transistors of the same conductivity type having respective drain, souce, and gate electrodes;

first and second terminals for receiving an operating voltage therebetween, the gate electrode of said first FET transistor being connected to said second terminal;

means for connecting said first and second FET transistors in series between said input terminal and a circuit node, that means comprising a connection between said input terminal and the source electrode of said second FET transistor, a connection between the drain and gate electrodes of said second transistor to the source electrode of said first transistor and a connection between the drain electrode of said first FET transistor and said circuit node;

impedance means for connecting said circuit node to said first terminal; and means for connecting said circuit node to said output terminal.

4. A watch circuit arrangement according to claim 3 wherein said means for connecting said circuit node to said output terminal comprises an inverter.

5. A watch circuit arrangement according to claim 4 wherein said impedance means comprises a third FET transistor of opposite conductivity type as said first transistor and having source, gate, and drain electrodes connected to said circuit node, said output terminal, and said first terminal, respectively.

6. A watch circuit arrangement according to claim 5 wherein said impedance means further includes a capacitor connected between said circuit node and said first terminal.

7. A watch circuit arrangement according to claim 2 wherein said oscillator comprises:

first and second FET transistors of opposite conductivity type having respective drain, source and gate electrodes;

means connecting said first and second FET transistors as an oscillator, that means comprising a connection between the respective gate electrodes thereof, a connection between the respective drain electrodes thereof, and feedback means connected between said gate and drain electrodes for conditioning said first and second FET transistors to oscillate;

first and second terminals for receiving an operating supply therebetween;

first means for connecting the source electrode of said first transistor to said first terminal, that means comprising a first resistor and a third FET transistor of the same conductivity type as said first FET transistor, the drain electrode of said third FET transistor and one end of said first resistor being connected to the source electrode of said first transistor, and the source electrode of said third FET transistor and the other end of said first resistor being connected to said first terminal;

second means for connecting the source electrode of said second transistor to said second terminal, that means comprising a second resistor and a fourth FET transistor of the same conductivity type as said second FET transistor, the drain electrode and one end of said second resistor being connected to the source electrode of said second FET transistor, the source electrode of said fourth FET transistor and the other end of said second resistor being connected to said second terminal; and means responsive to said binary control signal at said gain control terminal for selectively conditioning said third and fourth transistors for conduction, that means comprising a connection between said gain control terminal and the gate electrode of said third FET transistor, and an inverter having input and output terminals the input terminal thereof connected to said gain control terminal and the output terminal thereof connected to the gate electrode of said fourth FET transistor.

8. A watch circuit arrangement comprising:

a battery;

an oscillator powered by said battery;

timekeeping circuitry responsive to said oscillator for providing output signal indication corresponding to the time;

a display responsive to said output signal indication of said timekeeping circuitry for displaying said time;

a display voltage generator including a voltage multiplier coupled to said oscillator for generating an output voltage which exceeds a given magnitude only after the receipt of a plurality of pulses from said oscillator; and a DC voltage threshold detector responsive to said output voltage for conditioning said oscillator to have a first gain level when said output voltage does not exceed said given magnitude, and for conditioning said oscillator to have a second gain level, lower than said first gain level, when said output voltage does exceed said given magnitude.

9. A watch circuit arrangement according to claim 1 further including a battery for providing a reference voltage of a first magnitude and a liquid crystal display device responsive to said output voltage of a second magnitude for providing a display, wherein the magnitude of said given magnitude is between said first and second magnitudes.

10. A watch circuit arrangement according to claim 8 wherein said battery provides a reference voltage of a first magnitude, said display is a liquid crystal device responsive to a second magnitude of said output voltage for providing a display and the magnitude of said given magnitude is between said first and second magnitudes.

* * * * *